United States Patent [19]
Kim

[11] Patent Number: 6,069,533
[45] Date of Patent: May 30, 2000

[54] CIRCUIT AND METHOD FOR AUTOMATICALLY ADJUSTING COMMON MODE REJECTION RATIO

[75] Inventor: Hong-Ki Kim, Kyungki-do, Rep. of Korea

[73] Assignee: Samsung Electronics Co., Ltd., Kyungki-do, Rep. of Korea

[21] Appl. No.: 08/971,295

[22] Filed: Nov. 17, 1997

[30] Foreign Application Priority Data

Nov. 16, 1996 [KR] Rep. of Korea .................. 96-54723

[51] Int. Cl.[7] ............................. H03F 3/45; H03F 3/00; H03F 1/26
[52] U.S. Cl. .......................... 330/258; 330/147; 330/149
[58] Field of Search ............................ 330/69, 149, 258, 330/259, 147

[56] References Cited

U.S. PATENT DOCUMENTS 3,581,198  5/1971  Shoemaker et al. .................. 330/2 X

*Primary Examiner*—Robert Pascal
*Assistant Examiner*—Patricia T. Nguyen
*Attorney, Agent, or Firm*—Sughrue, Mion, Zinn, Macpeak & Seas, PLLC

[57] ABSTRACT

A circuit and method for automatically adjusting a common mode rejection ratio. The circuit includes a mixing circuit for mixing two input signals received via first and second channel input terminals, eliminating noise from the input signals, and supplying a corresponding output signal; and a controller for simultaneously supplying a DC voltage having a predetermined level to the two channel input terminals when a main power source is initially applied, detecting the level of a voltage fed back from an output terminal of the mixing circuit, and controlling an output voltage level of the mixing circuit based on the detected voltage level.

11 Claims, 3 Drawing Sheets

CIRCUIT AND METHOD FOR AUTOMATICALLY ADJUSTING COMMON MODE REJECTION RATIO

BACKGROUND OF THE INVENTION

1. Field of the Invention

The present invention relates to an acoustic apparatus of an audio/video system and, more particularly, to an apparatus for automatically adjusting a common mode rejection ratio of a balance circuit to improve tone quality.

2. Description of the Related Art

Typically, achieving high tone quality is an important concern in audio/video systems. Further, an important factor in achieving high tone quality is a signal-to-noise (S/N) ratio. The S/N ratio is adjusted by using a balance circuit. FIG. 1 shows a conventional balance circuit. A signal Vi1 received through a left channel Lch is applied to a non-inverting input terminal of an operational amplifier 10 used as a mixer. A signal Vi2 received through a right channel Rch is applied to an inverting input terminal of the operational amplifier 10 which is used as a mixer. The operational amplifier (mixer) 10 can obtain a high S/N ratio without being greatly influenced by external noise when signals supplied to inverting and non-inverting input terminals of the mixer 10 have symmetrical levels. In order to supply symmetrical signal levels to the inverting and non-inverting input terminals of the mixer 10, the output of the mixer 10 should be maintained at "0" by adjusting the input resistances of the input terminals of the mixer 10. Output values Vo1 and Vo2 of the non-inverting and inverting input terminals of the mixer 10 can be obtained by the following equations (1) and (2), respectively:

$$Vo1 = \left(\frac{R3 + R4}{R4}\right) \times \left(\frac{R2 + VR}{R1 + R2 + VR}\right) \times Vi1 \quad (1)$$

$$Vo2 = -\frac{R4}{R3} \times Vi2 \quad (2)$$

When the output of the mixer 10 is "0", the following conditions should be satisfied as derived from the equations (1) and (2): Vi1=Vi2, and R1=(R2+VR)=R3=R4.

Consequently, a high S/N ratio can be obtained by appropriately adjusting the resistance of a variable resistor VR. However, in order to adjust the S/N ratio using such a balance circuit, a user must manually adjust an internal variable resistance. As a result, it is difficult to minutely adjust the variable resistance when a signal is attenuated to −80 dB or more. Moreover, even if the internal variable resistance of the balance circuit is set, the set variable resistance may vary because of an external shock.

SUMMARY OF THE INVENTION

It is therefore an object of the present invention to provide an apparatus and method for automatically adjusting a common mode rejection ratio of a balance circuit to improve tone quality in an acoustic apparatus of an audio/video system.

In accordance with one aspect of the present invention, a circuit for automatically adjusting a common mode rejection ratio includes a mixing circuit for mixing input signals received from first and second channel input terminals, eliminating noise from the input signals, and supplying an output signal; and a controller for simultaneously supplying a DC voltage having a predetermined level to the first and second channel input terminals when a main power source is initially applied, detecting the voltage level of output signal from the mixing circuit, and controlling the voltage level of the mixing circuit based on the detected voltage level.

In accordance with another aspect of the present invention, a method for automatically adjusting a common mode rejection ratio of a circuit including a differential amplifier for amplifying a difference between signals received at first and second input terminals; a common mode input resistance adjuster connected in parallel to a non-inverting input terminal of the differential amplifier for eliminating signal noise by controlling a common mode input resistance of the differential amplifier; and a controller for simultaneously supplying DC voltages of a prescribed level to the first and second input terminals, detecting a voltage level of an output signal of the differential amplifier, and controlling the voltage level of the output signal from the differential amplifier including the steps of: supplying a DC voltage of a prescribed level to the first and second input terminals when a main power source is initially applied; amplifying a difference DC voltages at the first and second input terminals of the differential amplifier; and adjusting the voltage level of the output signal of the differential amplifier by controlling a resistance of the common mode input resistance adjuster according to the voltage level of the output signal of the differential amplifier.

BRIEF DESCRIPTION OF THE DRAWINGS

The above and other objects, features and advantages of the present invention will be more apparent from the following detailed description taken with the accompanying drawings, in which like reference numerals or symbols designate like elements and in which.

DETAILED DESCRIPTION OF THE PREFERRED EMBODIMENT

In the following description, numerous specific details such as circuit elements are set forth to provide a more thorough understanding of the present invention. It will be apparent, however, to one skilled in the art that the present invention may be practiced without these specific details. Moreover, well known functions and constructions which may obscure the present invention in unnecessary detail are not described in detail.

Figure 1:
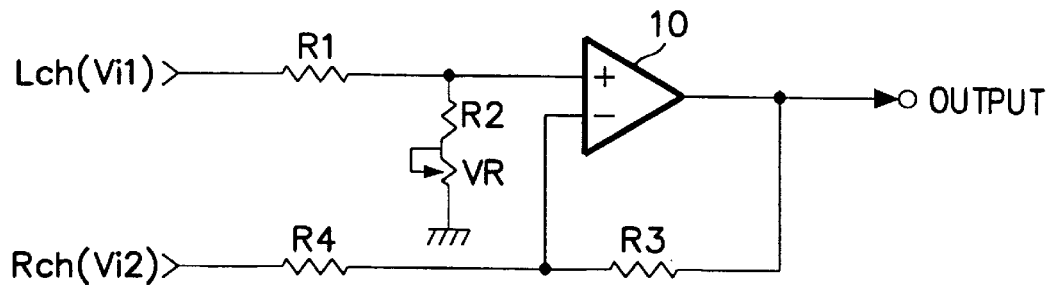
FIG. 1 is a schematic diagram of a conventional circuit for adjusting a common mode rejection ratio.
Figure 2:
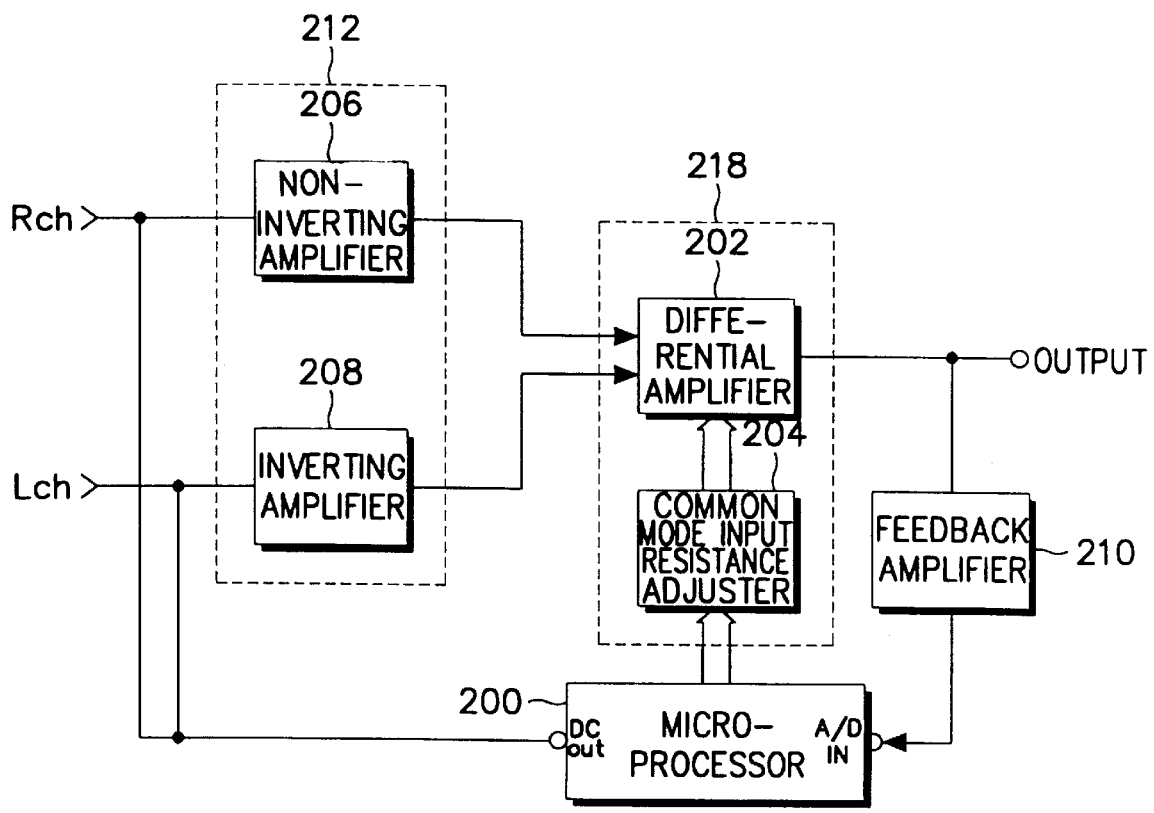
FIG. 2 is a block diagram of a circuit for automatically adjusting the common mode rejection ratio according to the present invention.

FIG. 2 is a block diagram of a circuit for automatically adjusting a common mode rejection ratio according to the present invention. The circuit of FIG. 2 includes a signal channel input part having a right channel Rch and a left channel Lch, a level amplifying circuit 212, a mixing circuit 218, a feedback amplifier 210 and a microprocessor 200 for controlling the circuit.

If a main power source is initially applied, the microprocessor 200 simultaneously supplies a direct current (DC) voltage of a prescribed level to two channel input terminals, detects the level of a voltage fed back from the mixing circuit 218 through an internal analog-to-digital converter, and generates a control signal for controlling an output level of the mixing circuit 218.

The level amplifying circuit 212 connected between the two channel input terminals and the mixing circuit 218 amplifies the DC voltage supplied to the two channel input terminals from the microprocessor 200. The level amplifying circuit 212 has a non-inverting amplifier 206 for amplifying a signal received at a right channel input terminal Rch and an inverting amplifier 208 for amplifying a signal received at a left channel input terminal Lch.

The mixing circuit 218 connected to the level amplifying circuit 212 mixes two signals generated from the level amplifying circuit 212, eliminates noise of the input signals, and supplies an output signal to the exterior. The mixing circuit 218 has a differential amplifier 202 for amplifying a difference between the two input signals. Further, a common mode input resistance adjuster 204 is connected in parallel to a non-inverting input terminal of the differential amplifier 202, for eliminating the noise by adjusting a common mode input resistance of the differential amplifier 202 under the control of the microprocessor 200.

The feedback amplifier 210 connected in parallel to an output terminal of the mixing circuit 218 provides an output signal in phase with a voltage fed back from the output terminal of the mixing circuit 218 and supplies the output signal to the microprocessor 200.

Figure 3:
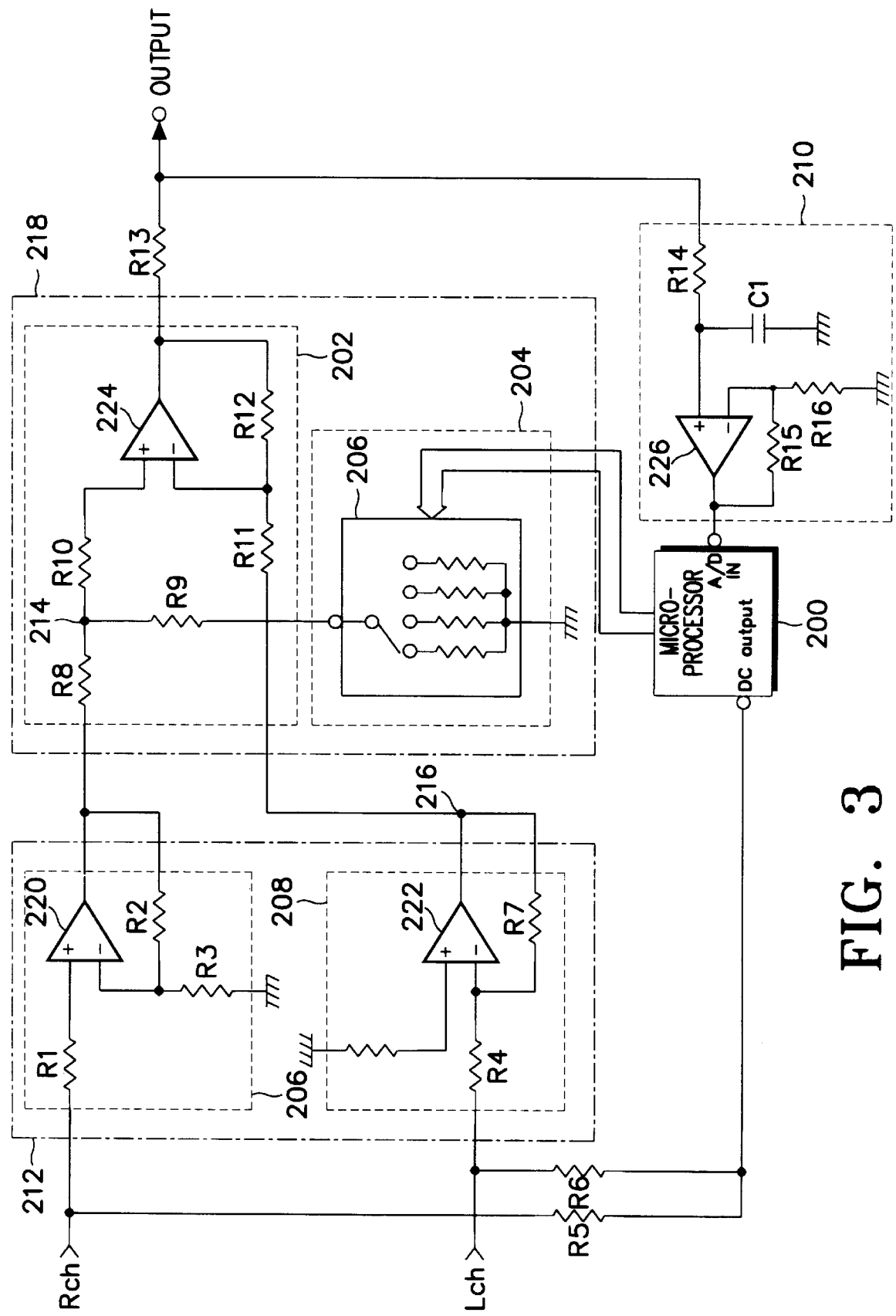
FIG. 3 is a detailed circuit diagram of the circuit of FIG. 2.

FIG. 3 is a detailed circuit diagram of the circuit of FIG. 2. Referring to FIG. 3, if the main power source is initially applied to the circuit for automatically adjusting the common mode rejection ratio, the microprocessor 200 supplies the DC voltage to the right channel input terminal Rch and the left channel input terminal Lch through its DC voltage output port. The DC voltage is supplied to the non-inverting input terminal of the non-inverting amplifier 206 which is connected to the right channel input terminal Rch, and to the inverting input terminal of the inverting amplifier 208 which is connected to the left channel input terminal Lch. Since an operational amplifier 220 of the non-inverting amplifier 206 and an operational amplifier 222 of the inverting amplifier 208 have the same amplification factor, the output voltages of the non-inverting and inverting amplifiers 206 and 208 are the same. The output voltages generated from the non-inverting amplifier 206 and the inverting amplifiers 208 are respectively supplied to the non-inverting and inverting input terminals of an operational amplifier 224 of the differential amplifier 202.

Figure 4A:
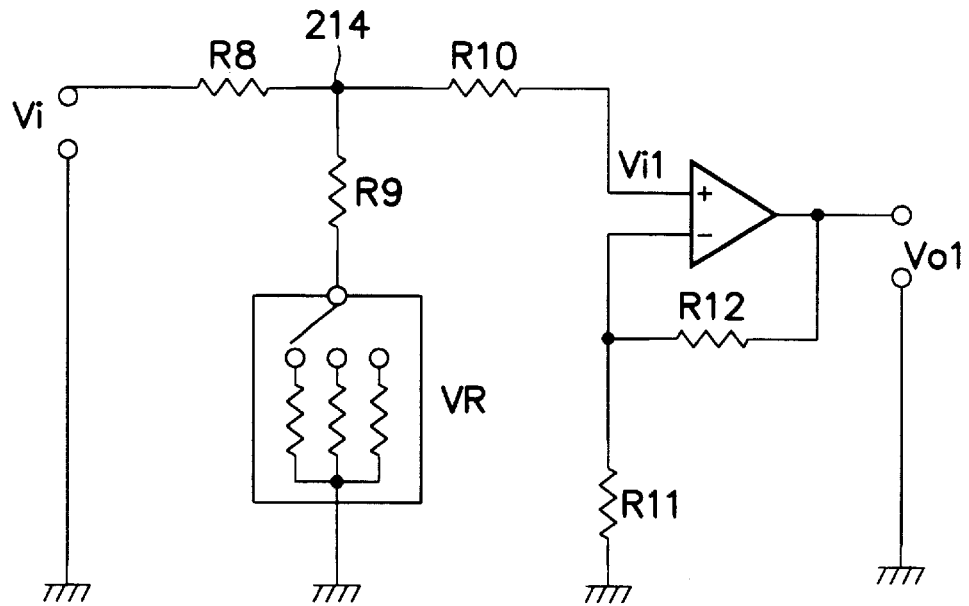
FIGS. 4A and 4B are equivalent circuit diagrams of a mixing circuit shown in FIG. 2.
Figure 4B:
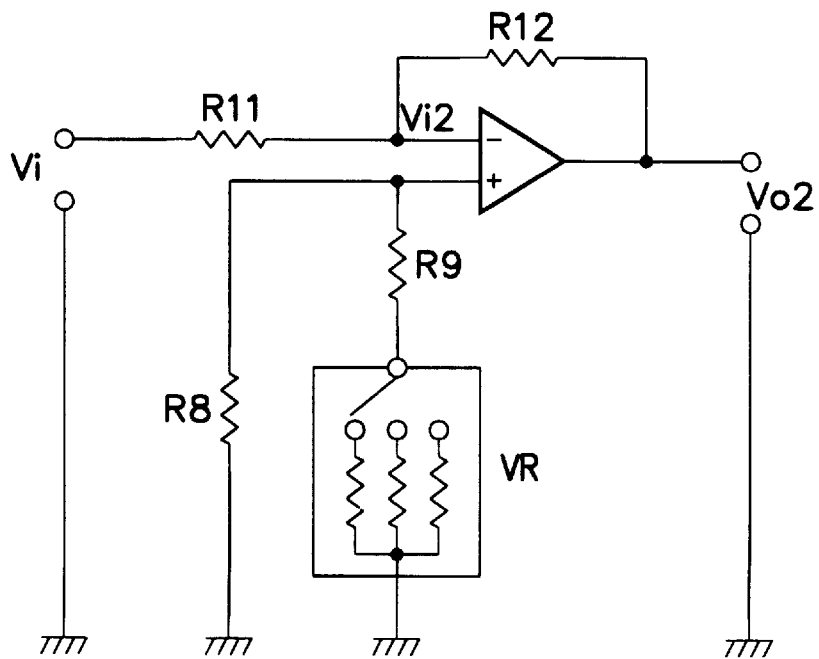

The amplification factor of the operational amplifier 224 of the differential amplifier 202 can be obtained by equivalent circuits shown in FIGS. 4A and 4B. FIG. 4A is an equivalent circuit diagram of the differential amplifier 202 seen from the non-inverting input terminal; and FIG. 4B is an equivalent circuit diagram of the differential amplifier 202 seen from the inverting input terminal. As shown in FIG. 4A, an input voltage Vi1 of the non-inverting input terminal of the differential amplifier 202 is represented by the following equation (3) and an output Vo1 of the non-inverting input terminal of the differential amplifier 202 is represented by the following equation (4):

$$Vi1 = \left(\frac{R9 + VR}{R9 + VR + R8}\right) \times Vi \quad (3)$$

$$Vo1 = \left(\frac{R9 + VR}{R9 + VR + R8} \times Vi\right) \times \left(\frac{R11 + R12}{R11}\right) \quad (4)$$

As shown in FIG. 4B, an input voltage Vi2 of the inverting input terminal of the differential amplifier 202 is represented by the following equation (5) and an output Vo2 of the inverting input terminal of the differential amplifier 202 is represented by the following equation (6):

$$Vi2 = Vi1 \quad (5)$$

$$Vo2 = (-Vi) \times \left(\frac{R12}{R11}\right) \quad (6)$$

Since a final output value Vo12 of the differential amplifier 202 is a difference between the output Vo1 of the inverting input terminal and the output Vo2 of the non-inverting input terminal, output value Vo12 can be represented by the following equation:

$$Vo12 = \left(\left(\frac{R9 + VR}{R9 + VR + R8}\right) \times Vi \times \left(\frac{R11 + R12}{R11}\right)\right) - \left(Vi \times \frac{R12}{R11}\right) \quad (7)$$

The final output value Vo12 of the differential amplifier 202 is amplified by the feedback amplifier 202 of a non-inverting amplifier and then supplied to the microprocessor 200. The microprocessor 200 receives the final output value Vo12 of the differential amplifier 202 and sets the output value Vo12 of the differential amplifier 202 to "0" by adjusting a resistance value of an electronic variable resistor VR (that is, the common mode input resistance adjuster 204) connected in parallel to the non-inverting input terminal of the differential amplifier 202. Consequently, the microprocessor 200 causes the inverting and non-inverting input voltages of the differential amplifier 202 to be symmetrical by setting values of resistors in the equation (7) to R8=R9+VR=R11=R12.

In another embodiment of the present invention, when there is a shock while a system is being operated, if the user selects an automatic adjusting key, the microprocessor cuts off the input signals received through the two input terminals and resets the system, thereby automatically adjusting the common mode rejection ratio.

As described above, in achieving high tone quality, a more stabilized output can be obtained by automatically adjusting the common mode rejection ratio of a balance circuit to improve tone quality in an acoustic apparatus of an audio/video system.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A circuit for automatically adjusting a common mode rejection ratio of a balance circuit to improve tone quality in an acoustic apparatus if an audio/video system, comprising:

first and second channel input terminals for respectively receiving first and second channel input signals;

a mixing circuit for mixing said first and second channel input signals received through said first and second channel input terminals, eliminating noise from said first and second channel input signals, and providing a corresponding mixing circuit output signal through an output terminal; and a controller for simultaneously providing a direct current (DC) voltage having a predetermined level to said first and second channel input terminals when a main power source is initially applied, detecting a voltage level of said mixing circuit output signal, and controlling the voltage level of said mixing circuit output signal based on the detected voltage level by automatically adjusting a common mode input resistance of said mixing circuit according to the detected voltage level of said mixing circuit output signal.

2. The circuit as set forth in claim 1, further comprising:

a level amplifying circuit connected between said first and second channel input terminals and said mixing circuit, for amplifying said DC voltage supplied to said first and second channel input terminals from said controller and supplying amplified first and second channel input signals to said mixing circuit.

3. The circuit as set forth in claim 2, wherein said level amplifying circuit comprises:

a non-inverting amplifier for providing an amplified first channel input signal which is in phase with said first channel input signal received through said first channel input terminal, wherein said first channel input terminal is a right channel input terminal; and an inverting amplifier for providing an amplified second channel input signal which is out of phase with said second channel input signal received through said second channel input terminal, wherein said second channel input signal is a left channel input terminal.

4. The circuit as set forth in claim 1, wherein said mixing circuit comprises:

a differential amplifier for amplifying a difference between said first and second channel input signals supplied to said first and second channel input terminals; and a common mode input resistance adjuster connected in parallel to a non-inverting input terminal of said differential amplifier, for eliminating noise by adjusting a common mode input resistance of said differential amplifier, wherein said common mode input resistance adjuster is controlled by said controller.

5. The circuit as set forth in claim 4, wherein said common mode input resistance adjuster comprises an electronic variable resistor whose resistance value is automatically adjusted by said controller.

6. The circuit as set forth in claim 1, further comprising:

a feedback amplifier connected to said output terminal of said mixing circuit for providing an output signal to said controller which is in phase with the said mixing circuit output signal.

7. A circuit for automatically adjusting a common mode rejection ratio of a balance circuit to improve tone quality in an acoustic apparatus if an audio/video system, comprising:

a level amplifying circuit connected to first and second input terminals, for amplifying a direct current (DC) voltage having a predetermined level supplied to said first and second input terminals which respectively receive first and second input signals;

a mixing circuit for mixing first and second amplified input signals provided by said level amplifying circuit, eliminating noise from said amplified first and second input signals, and supplying a corresponding mixing circuit output signal through an output terminal;

a feedback amplifier connected to said output terminal of said mixing circuit for providing an output signal which is in phase with said mixing circuit output signal; and a controller for simultaneously supplying said DC voltage to said two input terminals when a main power source is initially applied, detecting a voltage level of said output signal provided by said feedback amplifier, and controlling a voltage level of said mixing circuit output signal level by automatically adjusting a common mode input resistance of said mixing circuit according to the detected voltage level of said output signal provided by said feedback amplifier.

8. The circuit as set forth in claim 7, wherein said level amplifying circuit comprises:

a non-inverting amplifier for providing an amplified first input signal which is in phase with said first input signal received through said first input terminal, wherein said first input terminal is a right channel input terminal; and an inverting amplifier for providing an amplified second input signal which is out of phase with said second input signal received through said second input terminal, wherein said second input terminal is a left channel input terminal.

9. The circuit as set forth in claim 7, wherein said mixing circuit comprises:

a differential amplifier for amplifying a difference between said amplified first and second input signals provided by said level amplifying circuit; and a common mode input resistance adjuster connected in parallel to a non-inverting input terminal of said differential amplifier, for eliminating a noise by controlling a common mode input resistance of said differential amplifier, wherein said common mode input resistance adjuster is controlled by said controller.

10. The circuit as set forth in claim 9, wherein said common mode input resistance adjuster comprises an electronic variable resistor whose resistance value is automatically adjusted by said controller.

11. A method for automatically adjusting a common mode rejection ratio of a circuit including a differential amplifier for amplifying a difference between first and second input signals respectively received by first and second input terminals; a common mode input resistance adjuster connected in parallel to a non-inverting input terminal of said differential amplifier for eliminating a noise by controlling a common mode input resistance of said differential amplifier; and a controller for simultaneously supplying a direct current (DC) voltage having a predetermined level to said first and second input terminals, detecting the voltage level of an output signal generated by said differential amplifier, and controlling the voltage level of said output signal generated by said differential amplifier; said method comprising the steps of:

supplying a DC voltage having a predetermined level to said first and second input terminals when a main power source is initially applied to the circuit;

amplifying a difference between DC voltages at said first and second input terminals of said differential amplifier; and controlling a voltage level said output signal generated by said differential amplifier by automatically adjusting a resistance of said common mode input resistance adjuster according to the voltage level of said output signal generated by said differential amplifier.

* * * * *